（12）United States Patent
Ohara

(10) Patent No.: US 12,327,999 B2
(45) Date of Patent: Jun. 10, 2025

(54) TRANSIENT VOLTAGE ABSORBING ELEMENT AND TRANSIENT VOLTAGE ABSORBING CIRCUIT

(71) Applicant: Murata Manufacturing Co., Ltd., Nagaokakyo (JP)

(72) Inventor: Tatsuya Ohara, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 81 days.

(21) Appl. No.: 18/485,504

(22) Filed: Oct. 12, 2023

(65) Prior Publication Data

US 2024/0039275 A1 Feb. 1, 2024

Related U.S. Application Data

(63) Continuation of application No. PCT/JP2022/016131, filed on Mar. 30, 2022.

(30) Foreign Application Priority Data

Apr. 13, 2021 (JP) ................. 2021-067574

(51) Int. Cl.
 *H02H 9/04* (2006.01)
(52) U.S. Cl.
 CPC .................. *H02H 9/045* (2013.01)
(58) Field of Classification Search
 CPC .......... H01L 27/04; H03H 7/01; H02H 9/007; H02H 9/045

(Continued)

(56) References Cited

U.S. PATENT DOCUMENTS

| 11,444,210 B2 * | 9/2022 | Pathak ..................... H01L 23/50 |
| 2005/0162790 A1 * | 7/2005 | Yoshinaga ............ H10D 89/601 |
| | | 361/56 |

(Continued)

FOREIGN PATENT DOCUMENTS

| JP | 2005217043 A | 8/2005 |
| JP | 2006156846 A | 6/2006 |

(Continued)

OTHER PUBLICATIONS

Machine translation of Lu et al. International Patent Document WO 2019000666 A1 Jan. 2019 (Year: 2019).*

(Continued)

*Primary Examiner* — Kevin J Comber
(74) *Attorney, Agent, or Firm* — ArentFox Schiff LLP

(57) ABSTRACT

A transient voltage absorbing element is provided that connected in shunt between a signal line on which inductors are connected in series and a reference potential. A first path connected in shunt between the signal line and the reference potential includes a diode including a first stray capacitance, a first parasitic inductor, and a first parasitic resistance that are connected in series. A second path connected in shunt between the signal line and the reference potential includes a second stray capacitance, a second parasitic inductor, and a second parasitic resistance that are connected in series. A capacitive property of a path formed between the signal line and the reference potential has frequency dependence. This capacitive property of the path is smaller in a frequency band of a signal that propagates through the signal line than in a frequency band other than the frequency band of the signal.

18 Claims, 13 Drawing Sheets

(58) Field of Classification Search
USPC .......................................................... 361/56
See application file for complete search history.

(56) References Cited

U.S. PATENT DOCUMENTS

| | | | |
|---|---|---|---|
| 2006/0114634 A1 | 6/2006 | Terada | |
| 2007/0076343 A1* | 4/2007 | Terada | H03H 7/38 |
| | | | 361/111 |
| 2013/0099353 A1* | 4/2013 | Kato | H01L 23/60 |
| | | | 257/659 |
| 2017/0373492 A1 | 12/2017 | Ueki | |
| 2019/0051644 A1 | 2/2019 | Ueki | |
| 2019/0123554 A1 | 4/2019 | Nakaiso | |
| 2019/0165464 A1 | 5/2019 | Lin et al. | |
| 2019/0319025 A1 | 10/2019 | Ueki | |

FOREIGN PATENT DOCUMENTS

| | | |
|---|---|---|
| JP | 2007103059 A | 4/2007 |
| JP | 2010057332 A | 3/2010 |
| JP | 2010251669 A | 11/2010 |
| JP | 2010278243 A | 12/2010 |
| JP | 2019103125 A | 6/2019 |
| WO | 2011021411 A | 2/2011 |
| WO | 2011152255 A1 | 12/2011 |
| WO | 2017159282 A1 | 9/2017 |
| WO | 2018025695 A1 | 2/2018 |
| WO | WO-2019000666 A1 * | 1/2019 ..... H03K 19/017509 |
| WO | 2019031036 A1 | 2/2019 |
| WO | 2019202774 A1 | 10/2019 |

OTHER PUBLICATIONS

International Search Report in PCT/JP2022/016131, mailed Jun. 14, 2022, 4 pages.

* cited by examiner

FIG. 17
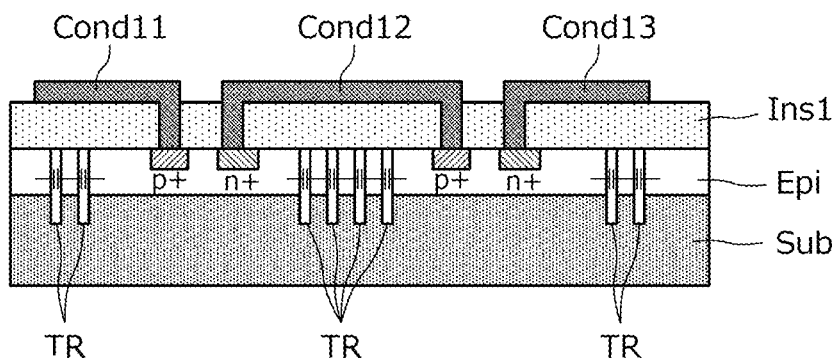
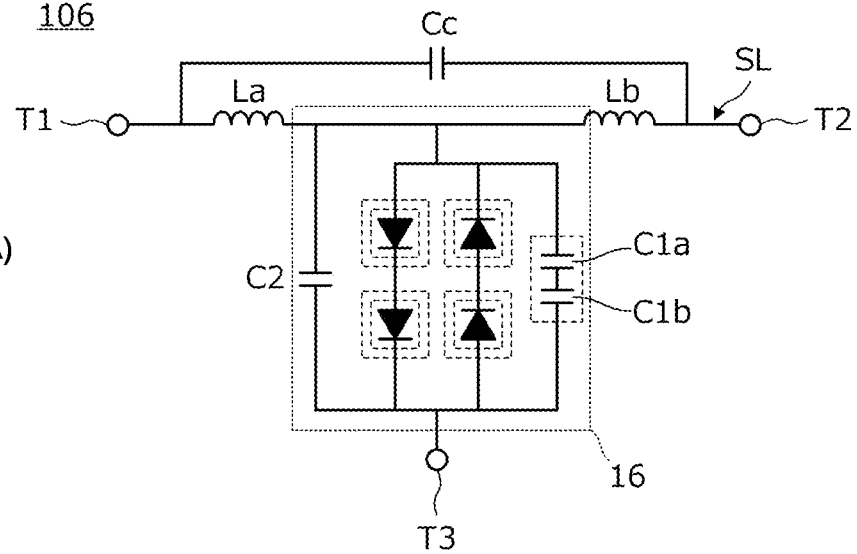
FIG. 18(A)
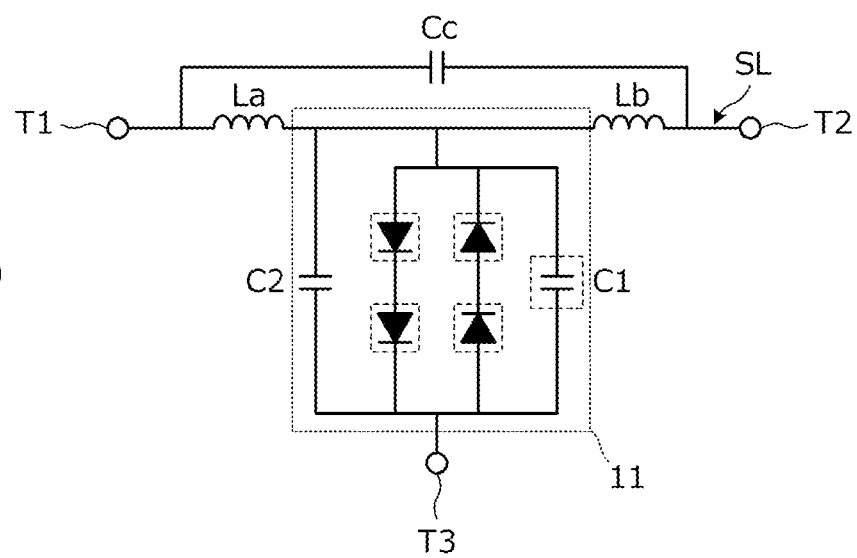
FIG. 18(B)

TRANSIENT VOLTAGE ABSORBING ELEMENT AND TRANSIENT VOLTAGE ABSORBING CIRCUIT

CROSS REFERENCE TO RELATED APPLICATIONS

This application is a continuation of International Application No. PCT/JP2022/016131, filed Mar. 30, 2022, which claims priority to Japanese Patent Application No. 2021-067574, filed Apr. 13, 2021, the entire contents of each of which are hereby incorporated by reference in their entirety.

TECHNICAL FIELD

The present invention relates to a transient voltage absorbing element configured to absorb transient abnormal voltage due to electrostatic discharge (ESD) or the like and surges such as lightning surges and switching surges, and a transient voltage absorbing circuit including the same and configured to protect electronic devices.

BACKGROUND

In general, when a transient voltage absorbing element is inserted between a transmission line and ground, high-frequency signals leak to the ground due to the stray capacitance of the transient voltage absorbing element, resulting in a deterioration in the transmission characteristics of the transmission line.

Japanese Patent Application Publication No. 2006-156846 (hereinafter "Patent Document 1") describes a transient voltage absorbing circuit configured to reduce the influence of the stray capacitance component of a transient voltage absorbing element by using a mutual inductance element or the like.

Moreover, Japanese Patent Application Publication No. 2010-57332 (hereinafter "Patent Document 2") describes a transient voltage absorbing circuit configured such that a series LC filter is formed by the stray capacitance of a diode, the frequency band of input signals is included in the pass band of the filter, and the main frequency of surges is included in the attenuation band of the filter.

FIG. 20 is a circuit diagram of a related-art transient voltage absorbing circuit. As shown, this transient voltage absorbing circuit includes a first terminal T1, a second terminal T2, a third terminal T3, and a signal line SL located between the first terminal T1 and the second terminal T2. The third terminal T3 is connected to a reference potential such as ground. Further, inductors La and Lb are connected in series on the signal line SL, and a diode BD, which serves as a transient voltage absorbing element, is connected in shunt between the signal line SL and the third terminal T3 (e.g., the reference potential). The diode BD, which serves as a transient voltage absorbing element, has a stray capacitance.

In addition, FIG. 21 is a diagram illustrating the frequency characteristics of a transmission coefficient S21 of the transient voltage absorbing circuit illustrated in FIG. 20. In FIG. 21, a characteristic curve A represents the frequency dependence of the transient voltage absorbing circuit when the above-mentioned stray capacitance is 0.1 pF, a characteristic curve B represents the frequency dependence of the transient voltage absorbing circuit when the above-mentioned stray capacitance is 0.3 pF, and a characteristic curve C represents the frequency dependence of the transient voltage absorbing circuit when the above-mentioned stray capacitance is 0.5 pF. Here, the 20 GHz band is the frequency band of the desired frequency to pass through. As a matter of course, here, "20 GHz" is merely an example.

To prevent a degradation in the transmission characteristics in high-frequency bands of transmission lines, it is important to reduce the stray capacitances of transient voltage absorbing elements. However, there is a trade-off relationship between the tolerance of a transient voltage absorbing element against the voltage applied to the transient voltage absorbing element and the stray capacitance of the transient voltage absorbing element. For example, when a diode is used as a transient voltage absorbing element, it is possible to reduce the stray capacitance without lowering the tolerance by adjusting the doping amount of the PN junction forming the diode. However, when the doping amount is fixed to a certain value due to the breakdown voltage or dynamic resistance determined by product specifications, to reduce the capacitance value of the above-mentioned stray capacitance formed by the depletion layer of the diode, it is required to reduce the area of the PN junction, leading to the problem of a decrease in the tolerance of the transient voltage absorbing element itself.

SUMMARY OF THE INVENTION

Accordingly, the exemplary aspects of the present invention provide a transient voltage absorbing circuit in which a transient voltage absorbing element has a transient voltage absorption function enhanced without causing a decrease in the high-frequency bandpass characteristics of a transmission line.

Thus, in an exemplary aspect, a transient voltage absorbing element is provided that is connected in shunt between a signal line on which inductors are connected in series and a reference potential. In this aspect, a capacitive property of a path formed between the signal line and the reference potential has frequency dependence. Moreover, the capacitive property of the path is smaller in a frequency band of a signal that propagates through the signal line than in a frequency band other than the frequency band of the signal.

In another exemplary aspect, a transient voltage absorbing element is provided that is connected in shunt between a signal line on which inductors are connected in series and a reference potential. In this aspect, the transient voltage absorbing element includes a first path that includes a first stray capacitance, a first parasitic inductor, and a first parasitic resistance connected and in shunt between the signal line and the reference potential; and second path that includes a second stray capacitance, a second parasitic inductor, and a second parasitic resistance connected in series and in shunt between the signal line and the reference potential. A first parasitic impedance due to the first parasitic inductor and the first parasitic resistance and a second parasitic impedance due to the second parasitic inductor and the second parasitic resistance are different in a frequency band of a signal that propagates through the signal line. Moreover, in an exemplary aspect, the first stray capacitance inserted on the first path or the second stray capacitance inserted on the second path that is located on a side of one of the first parasitic impedance and the second parasitic impedance that achieves a higher parasitic impedance in the frequency band of the signal has a reduced influence.

According to another exemplary aspect, a transient voltage absorbing circuit is provided that includes a transient voltage absorbing element connected in shunt between a signal line and a reference potential; and inductors connected in series on the signal line. A capacitive property of a path formed between the signal line and the reference potential has frequency dependence. Moreover, the capacitive property of the path is smaller in a frequency band of a signal that propagates through the signal line than in a frequency band other than the frequency band of the signal.

In yet another exemplary aspect, a transient voltage absorbing circuit is provided that includes a transient voltage absorbing element connected in shunt between a signal line and a reference potential; and inductors connected in series on the signal line. The transient voltage absorbing circuit includes a first path that includes a first stray capacitance, a first parasitic inductor, and a first parasitic resistance connected in series and in shunt between the signal line and the reference potential; and a second path that includes a second stray capacitance, a second parasitic inductor, and a second parasitic resistance connected in series and in shunt between the signal line and the reference potential. A first parasitic impedance due to the first parasitic inductor and the first parasitic resistance and a second parasitic impedance due to the second parasitic inductor and the second parasitic resistance are different in a frequency band of a signal that propagates through the signal line. Moreover, in an exemplary aspect, the first stray capacitance inserted on the first path or the second stray capacitance inserted on the second path that is located on a side of one of the first parasitic impedance and the second parasitic impedance that achieves a higher parasitic impedance in the frequency band of the signal has a reduced influence.

According to the exemplary aspects of the present invention, a transient voltage absorbing circuit is provided in which the transient voltage absorbing element has the surge absorption function enhanced without causing a decrease in the high-frequency bandpass characteristics of the transmission line.

BRIEF DESCRIPTION OF DRAWINGS

FIG. 17 is a sectional view of a transient voltage absorbing element 16 according to a sixth exemplary embodiment.

FIG. 18(A) is a circuit diagram of a transient voltage absorbing circuit 106 including the transient voltage absorbing element 16. FIG. 18(B) is a circuit diagram of a transient voltage absorbing circuit including the transient voltage absorbing element 11 illustrated in FIG. 5.

DETAILED DESCRIPTION OF EMBODIMENTS

Figure 1:
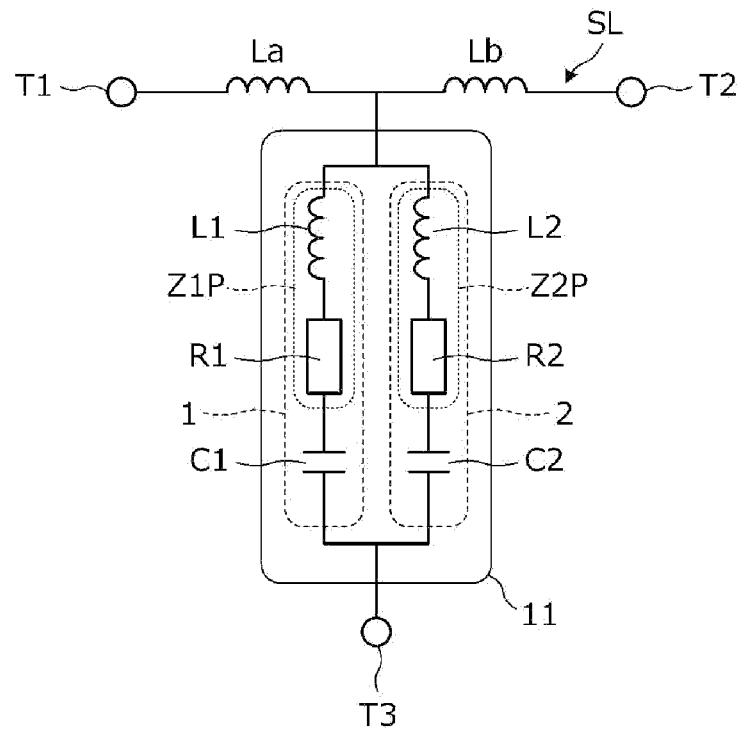
FIG. 1 is a circuit diagram of a transient voltage absorbing circuit 101 according to a first exemplary embodiment.

As set forth below, several specific examples are given with reference to the drawings to describe a plurality of modes for carrying out the exemplary aspects of the present invention. It is noted that the same parts or components are denoted by the same reference characters in the respective drawings. In consideration of description or ease of understanding of main points, the plurality of embodiments are separately described for the sake of convenience of description. However, it is noted that the configurations described in different embodiments can be partially replaced or combined. In second and subsequent embodiments, a description of matters common to a first embodiment is omitted, and only differences are described. In particular, similar actions and effects achieved by similar configurations are not repeatedly mentioned for each embodiment.

First Exemplary Embodiment

FIG. 1 is a circuit diagram of a transient voltage absorbing circuit 101 according to the first exemplary embodiment. As shown, the transient voltage absorbing circuit 101 includes a first terminal T1, a second terminal T2, a third terminal T3, and a signal line SL located between the first terminal T1 and the second terminal T2. The third terminal T3 is connected to a reference potential, such as ground. Further, inductors La and Lb are connected in series on the signal line SL, and a transient voltage absorbing element 11 is connected in shunt between the signal line SL and the third terminal T3 (e.g., a reference potential).

The transient voltage absorbing element 11 is a two-terminal element and includes, between its terminals, a diode as its main portion. Further, the transient voltage absorbing element 11 includes a first stray capacitance C1, a first parasitic inductor L1, a first parasitic resistance R1, a second stray capacitance C2, a second parasitic inductor L2, and a second parasitic resistance R2, which are configured as parasitic components.

As described later, the diode includes two diodes connected in series with their forward directions opposite to each other.

The inductors La and Lb are inductance components included in the signal line SL, and in FIG. 1, the inductors La and Lb are illustrated as circuit elements.

The transient voltage absorbing circuit 101 forms a low pass filter by the inductors La and Lb, and the stray capacitance component of the transient voltage absorbing element 11.

According to the exemplary aspect, the transient voltage absorbing element 11 includes a first path 1 connected in shunt between the signal line SL and the third terminal T3, and a second path 2 connected in shunt between the signal line SL and the third terminal T3. The first path 1 includes the first stray capacitance C1, the first parasitic inductor L1, and the first parasitic resistance R1 that are connected in series. Further, the second path 2 includes the second stray capacitance C2, the second parasitic inductor L2, and the second parasitic resistance R2 that are connected in series.

In FIG. 1, the parasitic impedance due to the first parasitic inductor L1 and the first parasitic resistance R1 is represented as a first parasitic impedance Z1P, and the parasitic impedance due to the second parasitic inductor L2 and the second parasitic resistance R2 is represented as a second parasitic impedance Z2P. In the frequency band of communication signals, the relationship Z1P>Z2P or Z1P<Z2P holds, where Z1P denotes the value of the first parasitic impedance Z1P and Z2P denotes the value of the second parasitic impedance Z2P. Due to this configuration, the resonant frequencies of the first path 1 and the second path 2 are different.

Figure 2:
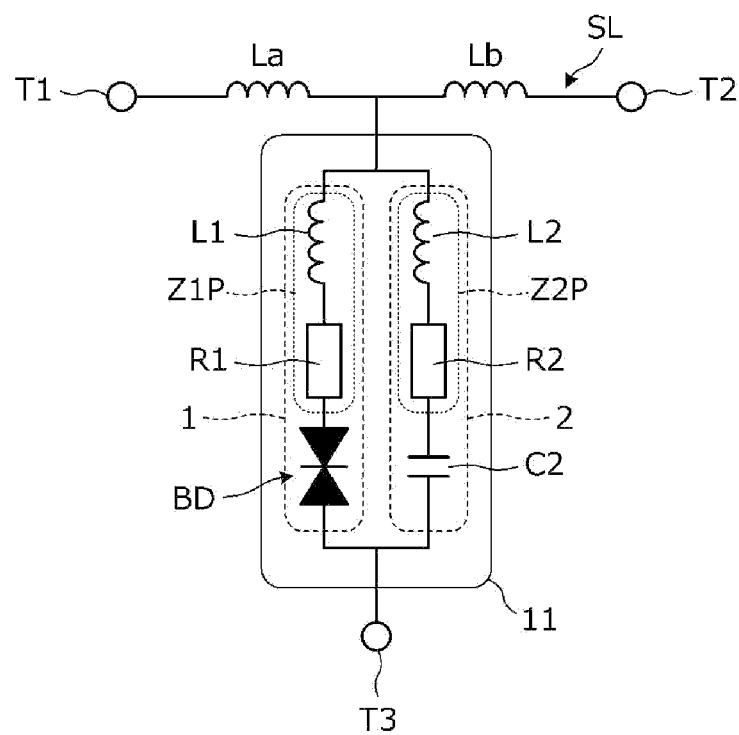
FIG. 2 is a circuit diagram of a specific configuration example of the transient voltage absorbing circuit 101 illustrated in FIG. 1.

FIG. 2 is a circuit diagram of a specific configuration example of the transient voltage absorbing circuit 101 illustrated in FIG. 1. As shown, the transient voltage absorbing circuit 101 includes diodes BD connected in series with their forward directions opposite to each other. The diode BD has the stray capacitance caused by the diode, such as the depletion layer capacitance and the stray capacitance generated between the wires in conduction with the BD diode. The first stray capacitance C1 of the transient voltage absorbing circuit 101 illustrated in FIG. 1 forms the stray capacitance caused by the diode BD. The second stray capacitance C2 of the transient voltage absorbing circuit 101 illustrated in FIG. 1 is the stray capacitance other than the depletion layer capacitance of the diode.

Figure 3A:
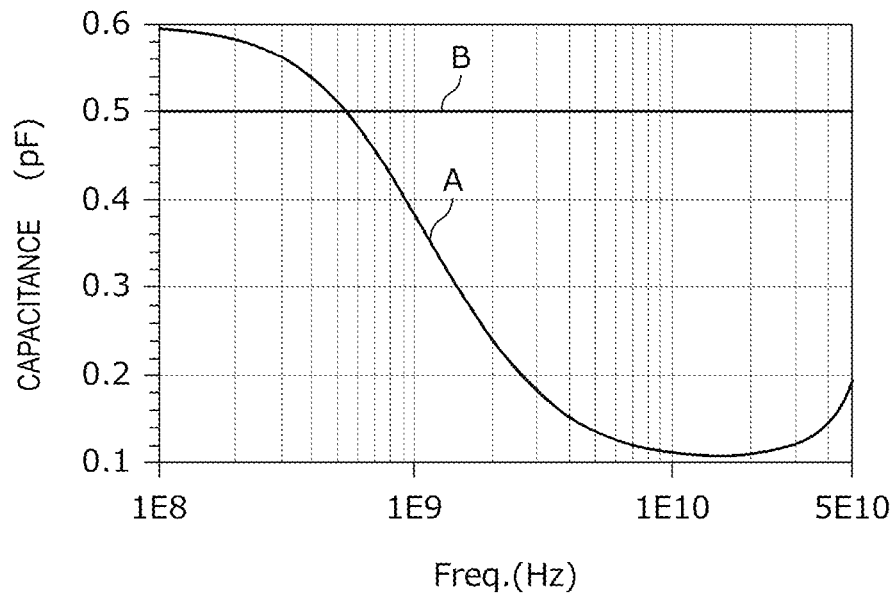
FIG. 3(A) is a diagram illustrating the frequency dependence of the capacitance of the stray capacitance of a transient voltage absorbing element 11.
Figure 3B:
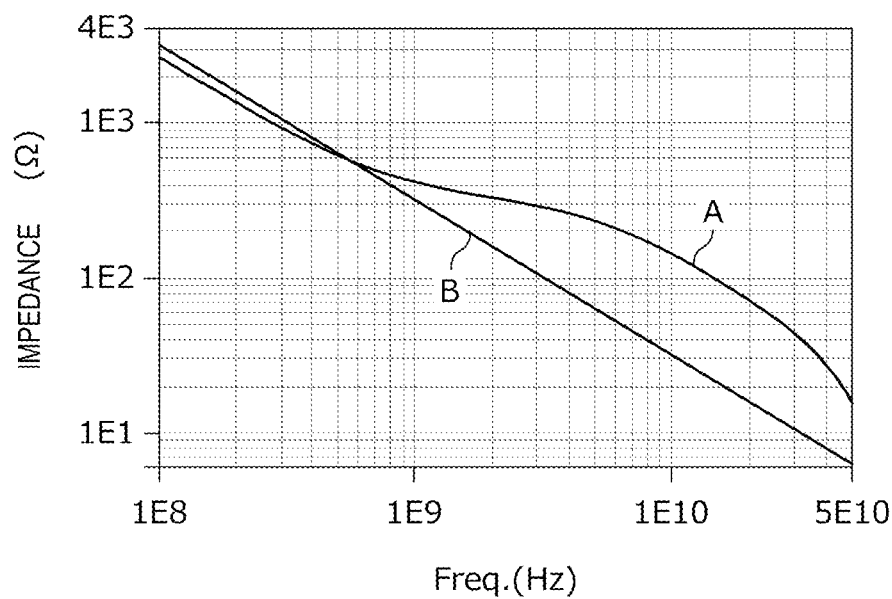
FIG. 3(B) is a diagram illustrating the frequency dependence of the impedance of the transient voltage absorbing element 11.

FIG. 3(A) is a diagram illustrating the frequency dependence of the capacitance of the stray capacitance (i.e., generated between the signal line SL and the third terminal T3 (reference potential) of the transient voltage absorbing circuit 101) of the transient voltage absorbing element 11. FIG. 3(B) is a diagram illustrating the frequency dependence of the impedance of the transient voltage absorbing element 11. A characteristic curve A in FIG. 3(A) and FIG. 3(B) represents the characteristics of the transient voltage absorbing element 11 according to the present embodiment, and a characteristic curve B in FIG. 3(A) and FIG. 3(B) represents the characteristics of a transient voltage absorbing element with a stray capacitance without frequency dependence. According to the exemplary aspect, the stray capacitance of the transient voltage absorbing element 11 according to the present embodiment is 0.38 pF at 1 GHz and 0.15 pF at 40 GHz.

The values of capacitance on the vertical axis in FIG. 3(A) are values converted from the imaginary part of the S parameters of the transient voltage absorbing element 11. In frequency bands lower than the frequency band of communication signals that propagate through the signal line SL, the transient voltage absorbing element 11 has a capacitive property, and hence the values converted from the imaginary part of the above-mentioned S parameters are capacitance values. However, in frequency bands higher than the resonant frequency of the transient voltage absorbing element 11, the transient voltage absorbing element 11 is inductive. In FIG. 3(A), the above-mentioned resonant frequency band is from 10 GHz to 20 GHz, and within this frequency band, the capacitance converted from the imaginary part of the S parameters is minimum. The frequency band of communication signals is from 10 GHz to 20 GHz. In FIG. 3(A), it seems that the capacitance value increases again in frequency bands higher than the frequency band of communication signals. This is because the imaginary part of the above-mentioned S parameters increases again due to the inductance components of the parasitic inductors L1 and L2 in such regions higher than the frequency band of communication signals.

Figure 4:
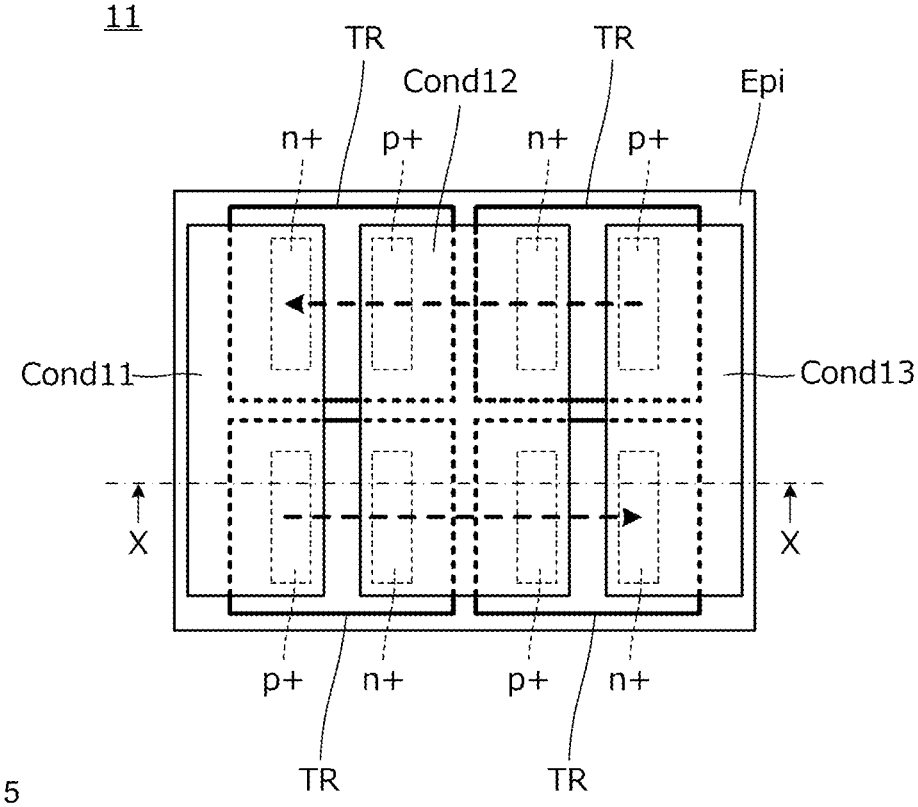
FIG. 4 is a plan view of the transient voltage absorbing element 11.
Figure 5:
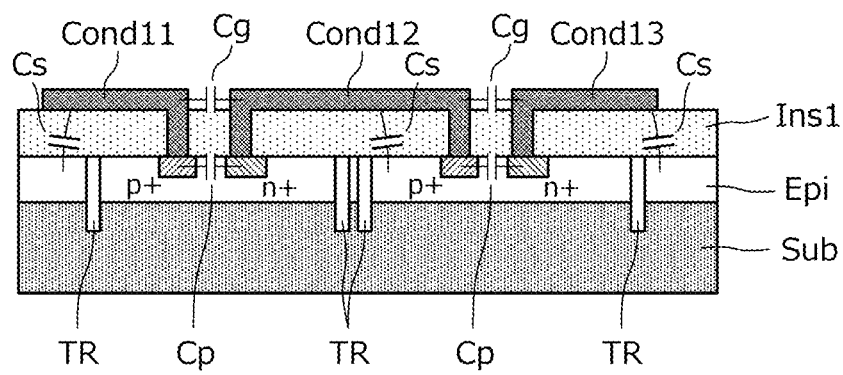
FIG. 5 is a sectional view taken along the X-X portion in FIG. 4.

FIG. 4 is a plan view of the transient voltage absorbing element 11. FIG. 5 is a sectional view taken along the X-X portion in FIG. 4. The transient voltage absorbing element 11 includes a semiconductor substrate portion. In particular, the semiconductor substrate portion includes a semiconductor substrate Sub, an epitaxial layer Epi, a trench TR, an insulator Ins1, and conductors Cond11, Cond12, and Cond13. In an exemplary aspect, the trench TR is formed from the epitaxial layer Epi to the semiconductor substrate Sub.

As the material of the semiconductor substrate Sub, for example, Si or GaAs can be used. The epitaxial layer Epi is, for example, an N-type epitaxial layer formed on the semiconductor substrate Sub. As the material of the insulator Ins1, for example, $SiO_2$ or SiN can be used. As the materials of the conductors Cond11, Cond12, and Cond13, for example, Al or Cu can be used.

A stray capacitance Cp of the diode is generated in each space between the p+ region and the n+ region (depletion layer of the diode). A stray capacitance Cg is formed between the conductor Cond11 and the conductor Cond12, as well as between the conductor Cond13 and the conductor Cond12, which are in conduction with the diode. Further, a stray capacitance Cs is formed between the conductors Cond11, Cond12, and Cond13 of the wiring layer, and the semiconductor substrate portion.

For example, the first stray capacitance C1 illustrated in FIG. 1 corresponds to the combined capacitance of the stray capacitance Cp of the depletion layer of the diode BD illustrated in FIG. 2 and the stray capacitance Cg between the above-mentioned conductors. Further, for example, the second stray capacitance C2 corresponds to the stray capacitance Cs formed between the conductors Cond11, Cond12, and Cond13, and the semiconductor substrate Sub.

Figure 6:
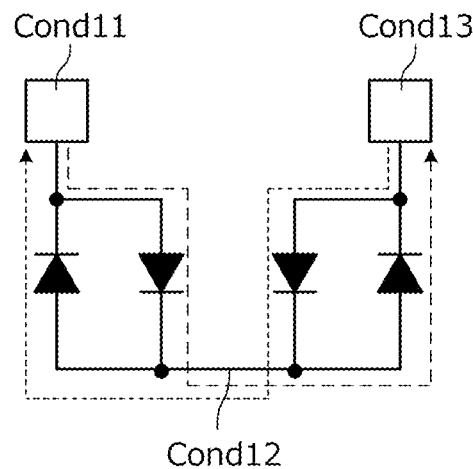
FIG. 6 is a circuit diagram of the transient voltage absorbing element 11 illustrated in FIG. 4.

FIG. 6 is a circuit diagram of the transient voltage absorbing element 11 illustrated in FIG. 4. It is noted that the dashed arrows in FIG. 4 indicate the paths and directions of the current flowing through the transient voltage absorbing element 11. That is, in operation, when a positive potential is applied to the leftmost conductor Cond11 in FIG. 4 and a voltage exceeding the forward voltage is applied to each diode, the current flows through the path [Cond11]→[p+]→[n+]→[Cond12]→[p+]→[n+]→[Cond13]. Further, in operation, when a positive potential is applied to the rightmost conductor Cond13 in FIG. 4 and a voltage exceeding the forward voltage is applied to each diode, the current flows through the path [Cond13]→[p+]→[n+]→[Cond12]→[p+]→[n+]→[Cond11].

Figure 7:
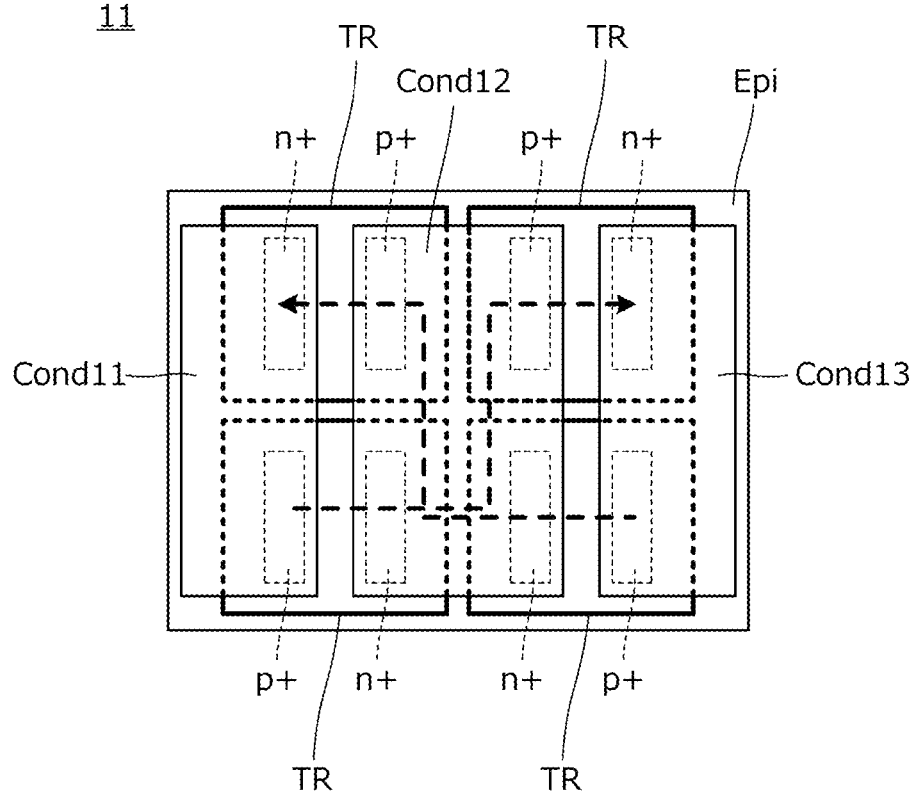
FIG. 7 is a plan view of the transient voltage absorbing element 11 different from the example illustrated in FIG. 4.

FIG. 7 is a plan view of the transient voltage absorbing element 11 different from the example illustrated in FIG. 4. This example is different from the example illustrated in FIG. 4 in the positional relationship between the n+ region and the p+ region. In this example as well, in operation, when a positive potential is applied to the leftmost conductor Cond11 in FIG. 7 and a voltage exceeding the forward voltage is applied to each diode, the current flows through the path [Cond11]→[p+]→[n+]→[Cond12]→[p+]→[n+]→[Cond13]. Further, ion operation, when a positive potential is applied to the rightmost conductor Cond13 in FIG. 7 and a voltage exceeding the forward voltage is applied to each diode, the current flows through the path [Cond13]→[p+]→[n+]→[Cond12]→[p+]→[n+]→[Cond11].

Figure 8:
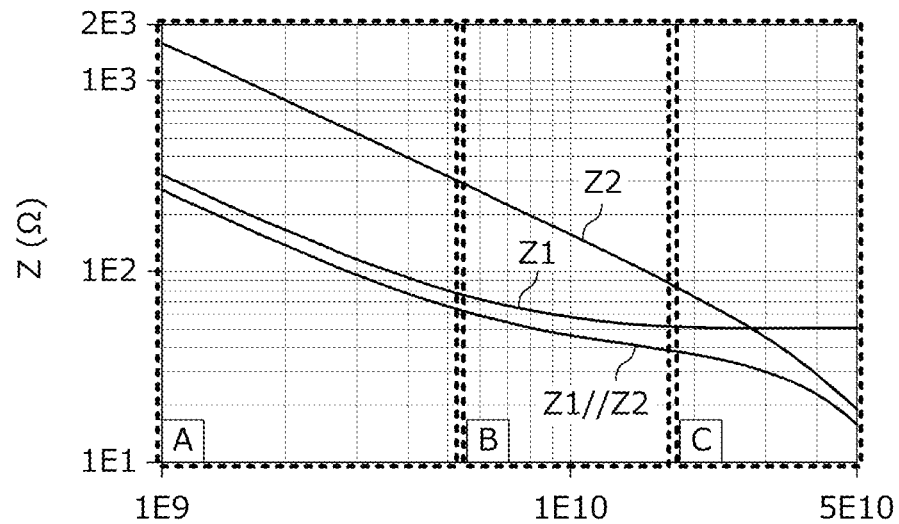
FIG. 8 is a diagram illustrating the frequency dependence of the impedance due to the stray capacitance of the transient voltage absorbing element 11.

FIG. 8 is a diagram illustrating the frequency dependence of the impedance due to the stray capacitance of the transient voltage absorbing element 11. In FIG. 8, the horizontal axis represents frequency, and the vertical axis represents impedance. In FIG. 8, a characteristic curve Z1 represents the frequency dependence of the impedance of the first path 1 in FIG. 1, and a characteristic curve Z2 represents the frequency dependence of the impedance of the second path 2 in FIG. 1. A characteristic curve Z1/Z2 represents the frequency dependence of the impedance of the transient voltage absorbing element 11.

In the example of FIG. 8, a range A represents a frequency region of from 1 GHz to 5.4 GHz, a range B represents a frequency region of from 5.4 GHz to 18 GHz, and a range C represents a frequency region of from 18 GHz to 50 GHz.

In FIG. 8, in the range A (e.g., low band), the combined capacitance of the first stray capacitance C1 of the first path 1 and the second stray capacitance C2 of the second path 2 of the transient voltage absorbing element 11 is observed. In the range B (e.g., mid band), the characteristics of the first parasitic resistance R1 are dominant as the first path 1 resonates (approaches the resonant frequency). In the range C (e.g., high band), the characteristics of the second stray capacitance C2 are dominant as the impedance of the second stray capacitance C2 falls below the impedance of the first stray capacitance C1. That is, since the stray capacitance of the transient voltage absorbing element 11 is small in the range C, which is a higher band than the range A and the range B, the resonance point of the low pass filter shifts to the higher band compared to the transient voltage absorbing circuit with the related-art configuration.

When Z1P>Z2P holds, where Z1P denotes the impedance of the first parasitic impedance Z1P due to the first parasitic inductor L1 and the first parasitic resistance R1, and Z2P denotes the impedance of the second parasitic impedance Z2P due to the second parasitic inductor L2 and the second parasitic resistance R2, the influence of the first stray capacitance C1 in FIG. 1 is reduced in the range B. In the example illustrated in FIG. 2, the combined capacitance of the stray capacitance Cp of the depletion layer of the diode BD and the stray capacitance Cg between the conductors in conduction with the diode substantially disappears. Further, when Z1P<Z2P holds, the influence of the second stray capacitance C2 in FIG. 1 is reduced in the range B. That is, in the example illustrated in FIG. 2, the stray capacitance Cs between the conductors in conduction with the diode and the semiconductor substrate Sub substantially disappears.

Figure 9:
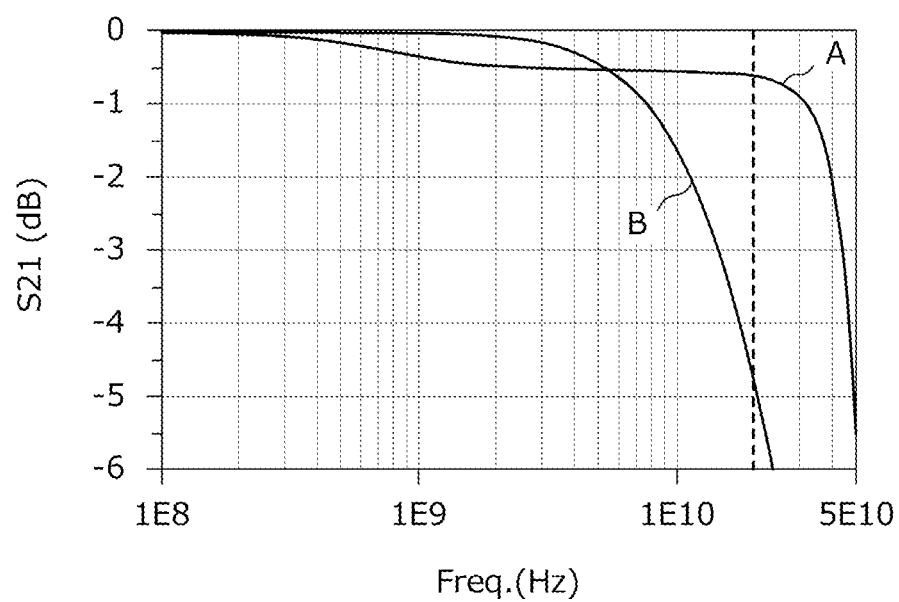
FIG. 9 is a diagram illustrating the frequency characteristics of a transmission coefficient S21 of the transient voltage absorbing circuit 101.

FIG. 9 is a diagram illustrating the frequency characteristics of a transmission coefficient S21 of the transient voltage absorbing circuit 101. In FIG. 9, a characteristic curve A represents the characteristics of the transient voltage absorbing circuit 101 according to the present embodiment. A characteristic curve B represents the characteristics of a comparative example when the first parasitic impedance Z1P and the second parasitic impedance Z2P illustrated in FIG. 1 are zero or the impedances of the first parasitic impedance Z1P and the second parasitic impedance Z2P are equal. In terms of capacitive property, the characteristic curve B corresponds to the characteristic curve B in FIG. 3(A) and FIG. 3(B).

In the example illustrated in FIG. 9, communication signals propagating through the signal line SL near 20 GHz are shunted to the third terminal T3 (reference potential). In this example, the signal power decreases to approximately −5 dB at around 20 GHz. In contrast to this, in the transient voltage absorbing circuit 101 according to the present embodiment, the capacitance is low around 20 GHz as represented by the characteristic curve A illustrated in FIG. 3(A) and FIG. 3(B). Thus, as illustrated in FIG. 9, the resonance point of the low pass filter shifts to the higher band compared to the transient voltage absorbing circuit with the related-art configuration. As a result, the signal power transmitting through the signal line SL decreases only to approximately −0.5 dB at 20 GHz.

Second Exemplary Embodiment

In the second embodiment, the overall structure of a transient voltage absorbing element and the intensity of an electric field with respect to the frequency of the transient voltage absorbing element are exemplified.

Figure 10:
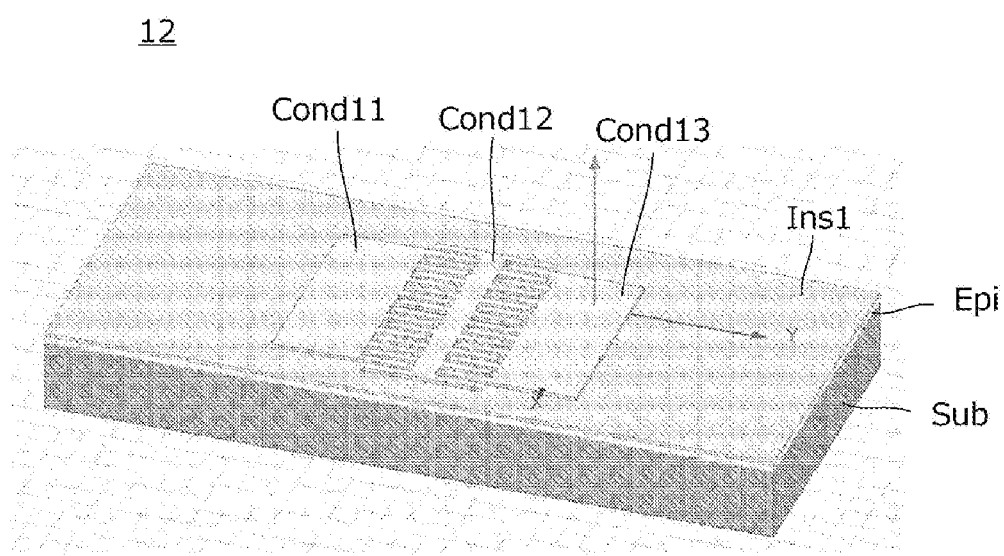
FIG. 10 is a perspective view of a transient voltage absorbing element 12 according to a second exemplary embodiment.

FIG. 10 is a perspective view of a transient voltage absorbing element 12 according to the second exemplary embodiment. However, it is noted that the upper part than the pattern of the conductors in conduction with the diode is not illustrated. The transient voltage absorbing element 12 illustrated in FIG. 10 includes the semiconductor substrate Sub, the N-type epitaxial layer Epi, the insulator Ins1, and the conductors Cond11, Cond12, and Cond13. It is also noted that the basic configurations of these are the same as those illustrated in FIG. 5.

Figure 11:
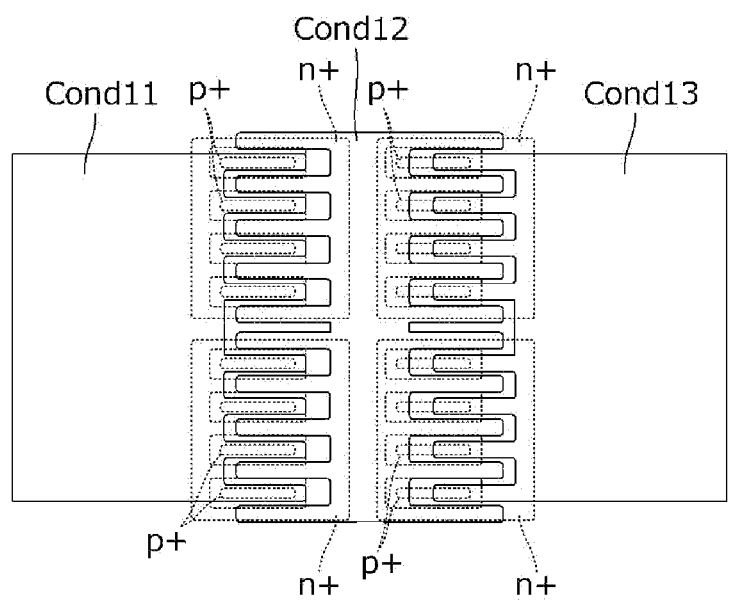
FIG. 11 is a plan view of the pattern of conductors in conduction with a diode in the transient voltage absorbing element 12.

FIG. 11 is a plan view of the pattern of conductors in conduction with a diode in the transient voltage absorbing element 12. As shown, the plurality of p+ regions are each surrounded by the n+ region. In FIG. 11, the plurality of p+ regions on the left side are in conduction with the conductor Cond11, and the plurality of n+ regions on the left side are in conduction with the conductor Cond12. Further, in FIG. 11, the n+ regions on the right side are in conduction with the conductor Cond12, and the p+ regions on the right side are in conduction with the conductor Cond13.

In the second embodiment, Z1P<Z2P holds, where Z1P denotes the impedance of the first parasitic impedance Z1P illustrated in FIG. 2, and Z2P denotes the impedance of the second parasitic impedance Z2P due to the second parasitic inductor L2 and the second parasitic resistance R2. Further, the second stray capacitance C2 mainly includes the stray capacitance Cs illustrated in FIG. 5, which is generated between the conductors in conduction with the diode and the semiconductor substrate portion. Further, the stray capacitance of the diode BD illustrated in FIG. 2 mainly includes the combined capacitance of the stray capacitance Cp of the depletion layer of the diode and the stray capacitance Cg between the conductors in conduction with the diode, the stray capacitance Cp and the stray capacitance Cg being illustrated in FIG. 5.

Figure 12:
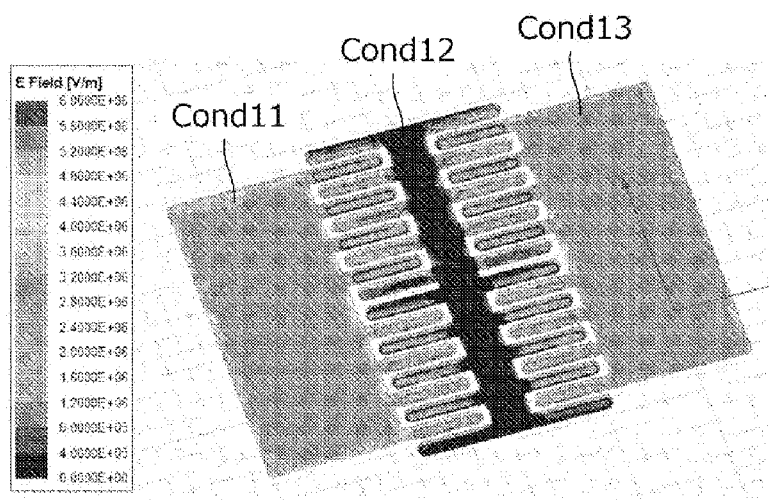
FIG. 12 is a diagram of the conductors as seen from the back, illustrating the intensity of the electric field in each part by the shade of color.
Figure 12:
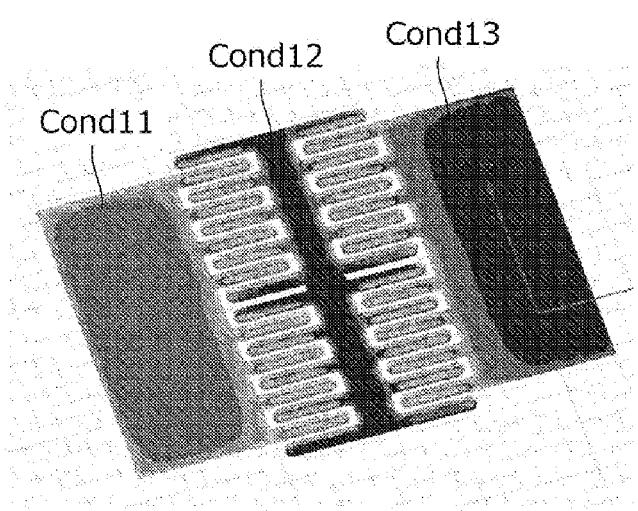

FIG. 12 is a diagram of the conductors as seen from the back, illustrating the intensity of the electric field in each part by the shade of color. The upper part of FIG. 12 illustrates the intensity of an electric field at 1 MHz, and the lower part of FIG. 12 illustrates the intensity of an electric field at 10 GHz. At 1 MHz, the intensity of the electric field at the central portion of the conductor Cond11 is 3.1e6 V/m, whereas at 10 GHz, the intensity of the electric field at the central portion of the conductor Cond11 is 4.5e5 V/m. That is, the intensity of the electric field at 10 GHz is approximately 85% lower than that at 1 MHz. In other words, since the relationship Z1P<Z2P holds, even when the stray capacitance Cs illustrated in FIG. 5, which is generated between the conductors Cond11 and Cond13 and the semiconductor substrate portion is large, the stray capacitance Cs (e.g., the second stray capacitance C2 illustrated in FIG. 2) disappears, that is, the influence thereof is reduced, in the frequency band of communication signals, with the result that a decrease in the signal intensity of communication signals is prevented.

It is noted that the stray capacitance Cs generated in the conductor Cond12 is a stray capacitance generated between the midpoint of the series capacitance of a stray capacitance Cp-Cp of the depletion layer formed by the two diodes connected in series, and the midpoint of the series capacitance of a stray capacitance Cs-Cs formed by the conductor Cond11 and the conductor Cond13, and hence there is no difference in potential to be applied to the stray capacitance Cs generated between the midpoints. Thus, as illustrated in FIG. 12, substantially no electric field is generated in the conductor Cond12. However, the presence of another path such as the parasitic capacitance due to, for example, the Cu wiring formed in the upper part results in some electric field generation. However, even when such an electric field is generated, such an electric field can be attenuated depending on the parasitic impedance generated in the path.

Here, the intentional difference in capacitance components of a transient voltage absorbing element between the low-frequency band that needs to be absorbed and the high-frequency band of communication signals that need to propagate is considered as follows.

For purposes of this disclosure, the term "low-frequency band" refers to the measurement frequencies in the TVS datasheet. The low-frequency band includes a frequency of 1 MHz and is defined in Item 4.7 of JIS C 5101-1: 2019. The high-frequency band is the frequency band of communication signals and is, for example, 10 GHz. When the intensity of the electric field in a conductor in conduction with a diode is 50% or lower as in the example illustrated in FIG. 12, it can be considered that there is an intentional difference as described above.

Third Exemplary Embodiment

Figure 13:
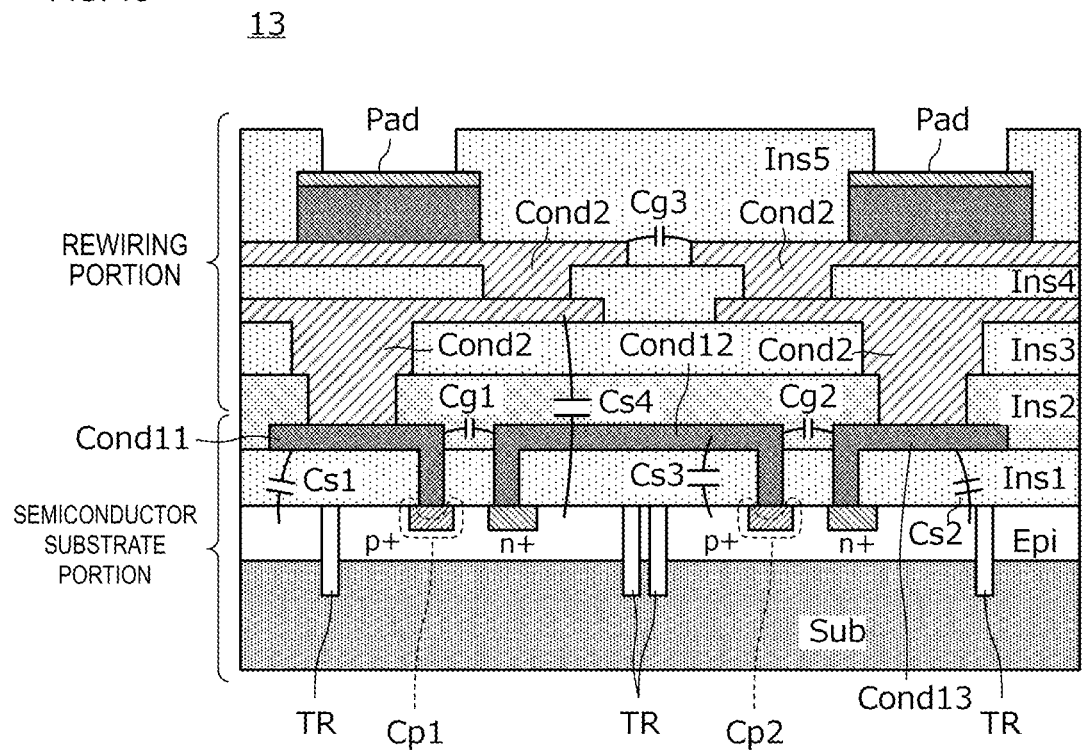
FIG. 13 is a sectional view of a transient voltage absorbing element 13 according to a third exemplary embodiment.
Figure 14:
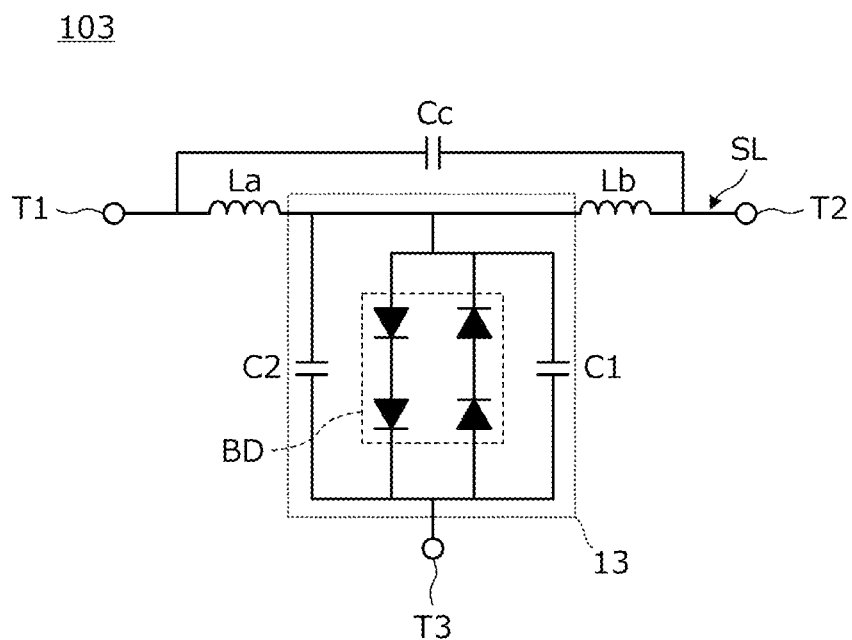
FIG. 14 is a circuit diagram of a transient voltage absorbing circuit 103 including the transient voltage absorbing element 13.

In the third embodiment, the overall structure of a transient voltage absorbing element is exemplified. FIG. 13 is a sectional view of a transient voltage absorbing element 13 according to the third exemplary embodiment. FIG. 14 is a circuit diagram of a transient voltage absorbing circuit 103 including the transient voltage absorbing element 13.

The transient voltage absorbing element 13 includes a semiconductor substrate portion and a rewiring portion. The semiconductor substrate portion includes the semiconductor substrate Sub, the epitaxial layer Epi, the trench TR, the insulator Ins1, and the conductors Cond11, Cond12, and Cond13. According to this exemplary aspect, the rewiring portion includes insulators Ins2, Ins3, Ins4, and Ins5, a conductor Cond2, and a pad Pad.

The epitaxial layer Epi is formed on the surface of the semiconductor substrate Sub. The outer layer of the epitaxial layer Epi has formed therein p+ regions and n+ regions. The insulator Ins1 is formed on the surface of the epitaxial layer Epi. The conductors Cond11, Cond12, and Cond13 are formed from the surface of the epitaxial layer Epi to the p+ regions and the n+ regions. Further, the trench TR is formed from the insulator Ins1 to the semiconductor substrate Sub.

The conductor Cond2 in conduction with the conductors Cond11 and Cond13 is formed in the rewiring portion. The pad Pad is formed on the conductor Cond2, which forms the topmost layer.

According to an exemplary aspect, the material of the semiconductor substrate Sub can be Si or GaAs. Moreover, the epitaxial layer Epi is, for example, an N-type epitaxial layer formed on the semiconductor substrate Sub. As the materials of the insulators Ins1, Ins2, Ins3, Ins4, and Ins5, for example, $SiO_2$, SiN, or solder resist can be used depending on their locations of formation. As the materials of the conductors Cond11, Cond12, and Cond13, for example, Al or Cu can be used.

As further shown, the pad Pad may include a plurality of layers of conductors for electrode formation. That is, the pad Pad may include, for example, a base layer and a surface layer, and may further include an adhesion layer between the base layer and the surface layer. For example, Ni, Cr, or alloys thereof can be used as the material of the base layer, T1 or W can be used as the material of the adhesion layer, and Au or other noble metals can be used as the material of the surface layer.

As illustrated in FIG. 13, stray capacitances Cp1 and Cp2 are formed in the depletion layer formed at the interface between the N-type epitaxial layer Epi and the p+ regions. Further, a stray capacitance Cg1 is formed between the conductor Cond11 and the conductor Cond12, and a stray capacitance Cg2 is formed between the conductor Cond12 and the conductor Cond13. Further, stray capacitances Cs1, Cs2, and Cs3 are formed between the conductors Cond11, Cond12, and Cond13, and the epitaxial layer Epi. A stray capacitance Cs4 is formed between the conductor Cond2 and the epitaxial layer Epi. Moreover, a stray capacitance Cg3 is formed between the conductor Cond2 and the conductor Cond2.

The transient voltage absorbing circuit 103 illustrated in FIG. 14 includes the first terminal T1, the second terminal T2, the third terminal T3, and the signal line SL located between the first terminal T1 and the second terminal T2. The third terminal T3 is connected to a reference potential such as ground. Further, the inductors La and Lb are connected in series on the signal line SL, and the transient voltage absorbing element 13 is connected in shunt between the signal line SL and the third terminal T3 (reference potential). Further, in this example, a capacitor Cc connected in parallel with the inductors La and Lb is included. With the capacitor Cc included between the first terminal T1 and the second terminal T2 in this way, a high pass filter is formed by this capacitor Cc. It is noted that in FIG. 14, the illustration of the parasitic inductors L1 and L2 and the parasitic resistances R1 and R2 illustrated in FIG. 1 is omitted.

In FIG. 14, the first stray capacitance C1 is a capacitor including, for example, the stray capacitances Cp1, Cp2, Cg1, Cg2, and Cg3 illustrated in FIG. 13. Further, the second stray capacitance C2 is a capacitor including, for example, the stray capacitances Cs1, Cs2, Cs3, and Cs4 illustrated in FIG. 13.

As described in the present embodiment, the stray capacitance formed between the signal line SL and the third terminal T3 (reference potential) may be formed in the rewiring portion.

Fourth Exemplary Embodiment

In the fourth exemplary embodiment, a transient voltage absorbing element including an inductance element for reducing the stray capacitance of the transient voltage absorbing element is exemplified.

Figure 15A:
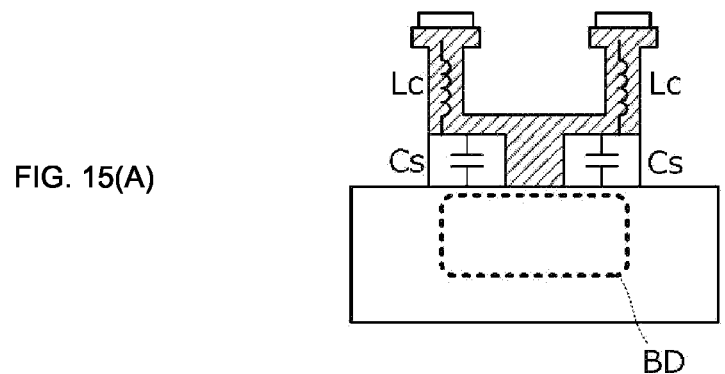
FIG. 15(A) and FIG. 15(B) are sectional views of a transient voltage absorbing element 14 according to a fourth exemplary embodiment.
Figure 15B:
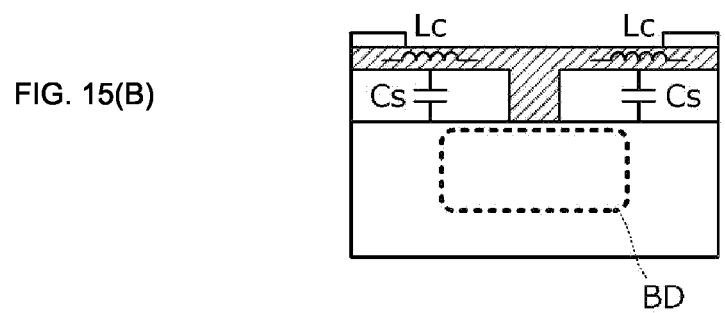

FIG. 15(A) and FIG. 15(B) are sectional views of a transient voltage absorbing element 14 according to the fourth exemplary embodiment. As shown, the transient voltage absorbing element 14 illustrated in FIG. 15(A) and FIG. 15(B) includes an inductive element Lc for reducing the capacitive property of the first path in the communication frequency band, in the rewiring layer formed on the surface of the semiconductor substrate.

In both the examples illustrated in FIG. 15(A) and FIG. 15(B), the inductive element Lc is formed by the Cu wiring formed in the rewiring layer. Further, the stray capacitance Cs is formed between this Cu wiring and the semiconductor substrate. The inductive element Lc forms a T-type low pass filter together with the stray capacitance of the diode, and hence the resonant frequency of the filter can be changed by changing the inductance of the inductive element.

In the example illustrated in FIG. 15(B), the stray capacitance generated between the inductive element Lc and the semiconductor substrate is large. However, in the example illustrated in FIG. 15(A), the Cu wiring forming the inductive element Lc is a via conductor, and hence the stray capacitance Cs generated between the inductive element Lc and the semiconductor substrate can be relatively small. Further, in this embodiment, there is an effect that even when the inductance of the inductive element Lc is increased or decreased, the stray capacitance Cs remains unchanged. Conversely, the balance of the left and right inductive elements Lc can be changed without changing the stray capacitance Cs. For example, the inductances of the left and right inductive elements Lc are preferably changed based on the equivalent series resistance (ESR) components included in the left and right inductive elements Lc.

Fifth Exemplary Embodiment

In the fifth embodiment, the configuration of a transient voltage absorbing circuit 105 including an element other than inductance or inductance components on the signal line is exemplified.

Figure 16:
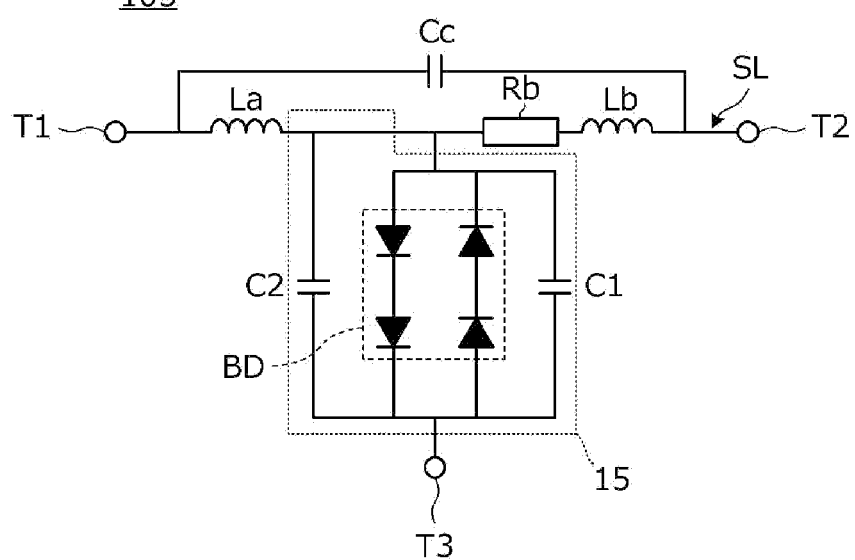
FIG. 16 is a circuit diagram of a transient voltage absorbing circuit 105 according to a fifth exemplary embodiment.

FIG. 16 is a circuit diagram of the transient voltage absorbing circuit 105 according to the fifth exemplary embodiment. According to the exemplary aspect, the transient voltage absorbing circuit 105 includes the first terminal T1, the second terminal T2, the third terminal T3, and the signal line SL located between the first terminal T1 and the second terminal T2. The third terminal T3 is connected to a reference potential such as ground. Further, the inductors La and Lb are connected in series on the signal line SL, and a transient voltage absorbing element 15 is connected in shunt between the signal line SL and the third terminal T3 (reference potential). On the signal line SL, a resistor or a resistance component Rb is formed. Further, in this example, the capacitor Cc connected in parallel with the inductors La and Lb is included. It is noted that in FIG. 16, the illustration of the parasitic inductors L1 and L2 and the parasitic resistances R1 and R2 illustrated in FIG. 1 is omitted.

It should be appreciated that the transient voltage absorbing circuit 105 according to the present embodiment is different from the transient voltage absorbing circuit 103 illustrated in FIG. 14 in that the resistor or resistance component Rb is formed. In the transient voltage absorbing circuit 105 of the present embodiment, between the signal line SL and the third terminal T3 (reference potential), the resistance component Rb is provided on one side relative to the connection point of the transient voltage absorbing element 15. In the case of such a circuit configuration, the inductances of the inductors La and Lb, which are connected in series on the signal line SL, are changed. Conversely, when the inductances of the inductors La and Lb are different, the value of the resistance component Rb may be determined accordingly.

Sixth Exemplary Embodiment

In the sixth embodiment, the locations of the stray capacitances generated due to the trench in a transient voltage absorbing element are exemplified.

FIG. 17 is a sectional view of a transient voltage absorbing element 16 according to the sixth embodiment. FIG. 18(A) is a circuit diagram of a transient voltage absorbing circuit 106 including the transient voltage absorbing element 16. FIG. 18(B) is a circuit diagram of a transient voltage absorbing circuit including the transient voltage absorbing element 11 illustrated in FIG. 5.

In the example illustrated in FIG. 17, the transient voltage absorbing element 16 includes the semiconductor substrate Sub, the N-type epitaxial layer Epi, and the insulator Ins1. The epitaxial layer Epi is formed on the surface of the semiconductor substrate Sub. The outer layer of the epitaxial layer Epi has formed therein p+ regions and n+ regions. The insulator Ins1 is formed on the surface of the epitaxial layer Epi. The conductors Cond11, Cond12, and Cond13 are formed from the surface of the insulator Ins1 to the p+ regions and the n+ regions. Further, the trench TR is formed from the insulator Ins1 to the semiconductor substrate Sub.

In FIG. 18(A), capacitors C1$a$ and C1$b$ represent the stray capacitances generated by the double trenches as the two capacitors connected in series. In FIG. 18(B), the first stray capacitance C1 represents the stray capacitance generated by the single trench as the single capacitor. In this way, compared to the example illustrated in FIG. 5, in the transient voltage absorbing element 15 illustrated in FIG. 18(A), since the epitaxial layer Epi of each diode is isolated by the double trench, the stray capacitance due to the trench can be reduced.

Seventh Exemplary Embodiment

In the seventh embodiment, a transient voltage absorbing element that can be represented by a circuit including three paths between the signal line and the reference potential is exemplified.

Figure 19:
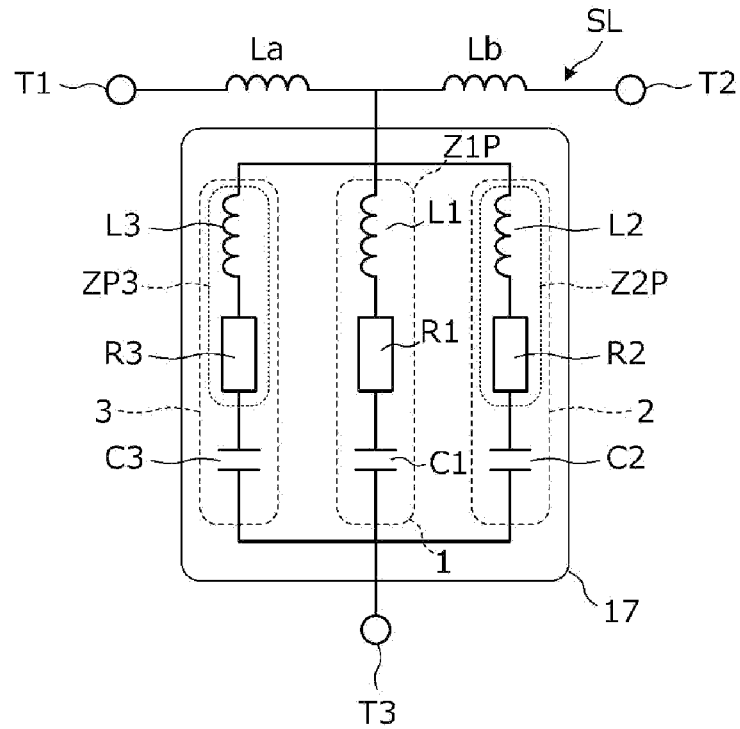
FIG. 19 is a circuit diagram of a transient voltage absorbing circuit 107 according to a seventh exemplary embodiment.
Figure 20:
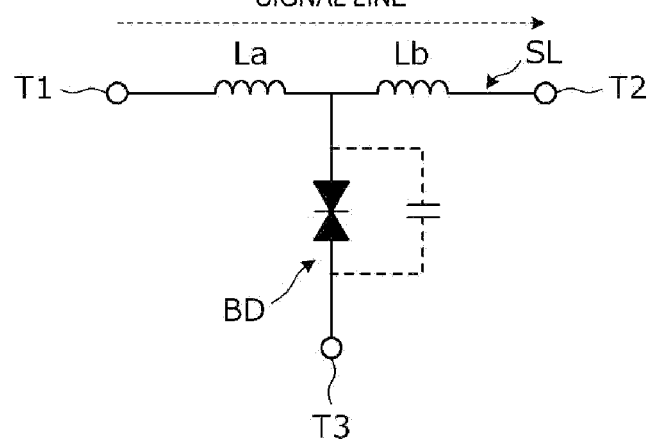
FIG. 20 is a circuit diagram of a related-art transient voltage absorbing circuit.
Figure 21:
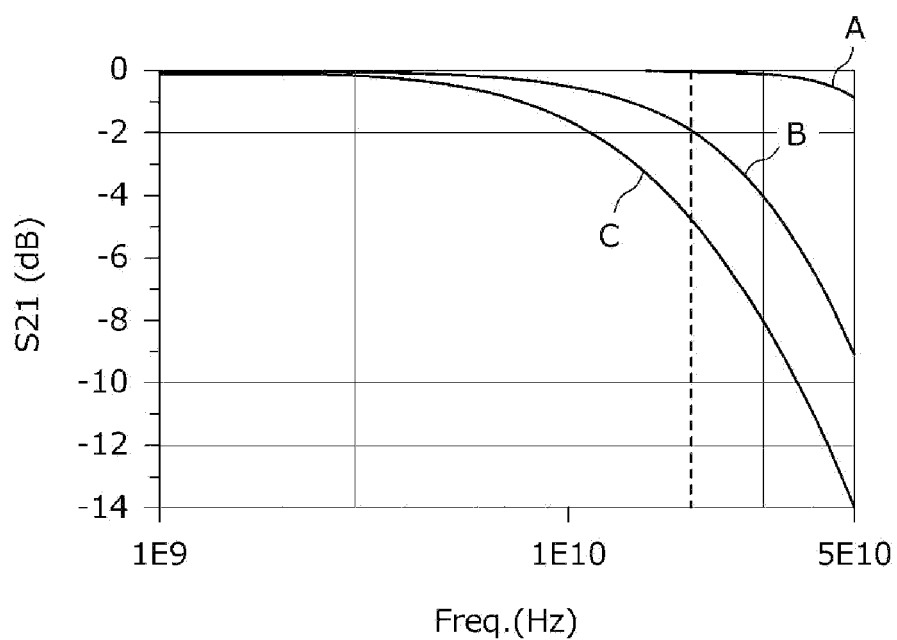
FIG. 21 is a diagram illustrating the frequency characteristics of the transmission coefficient S21 of the transient voltage absorbing circuit illustrated in FIG. 20.

FIG. 19 is a circuit diagram of a transient voltage absorbing circuit 107 according to the seventh embodiment. This transient voltage absorbing circuit 107 includes the first terminal T1, the second terminal T2, the third terminal T3, and the signal line SL located between the first terminal T1 and the second terminal T2. The third terminal T3 is connected to a reference potential such as ground. Further, the inductors La and Lb are connected in series on the signal line SL, and a transient voltage absorbing element 17 is connected in shunt between the signal line SL and the third terminal T3 (e.g., reference potential).

According to the exemplary aspect, the transient voltage absorbing element 17 is a two-terminal element and includes, between its terminals, a diode as its main portion. The transient voltage absorbing element 17 includes the first path 1 connected in shunt between the signal line SL and the third terminal T3, the second path 2 connected in shunt between the signal line SL and the third terminal T3, and a third path 3 connected in shunt between the signal line SL and the third terminal T3. The first path 1 includes the first stray capacitance C1, the first parasitic inductor L1, and the first parasitic resistance R1 that are connected in series. The second path 2 includes the second stray capacitance C2, the second parasitic inductor L2, and the second parasitic resistance R2 that are connected in series. Further, the third path 3 includes a third stray capacitance C3, a third parasitic inductor L3, and a third parasitic resistance R3 that are connected in series. The parasitic impedance due to the first parasitic inductor L1 and the first parasitic resistance R1 is represented as the first parasitic impedance Z1P, the parasitic impedance due to the second parasitic inductor L2 and the second parasitic resistance R2 is represented as the second parasitic impedance Z2P, and the parasitic impedance due to the third parasitic inductor L3 and the third parasitic resistance R3 is represented as a third parasitic impedance Z3P.

The basic structure of the transient voltage absorbing element 17 is as described in FIG. 5 and FIG. 13, and it can be said that the seventh embodiment corresponds to the transient voltage absorbing element of FIG. 5 or FIG. 13 represented as an equivalent circuit including three paths.

The diode includes two diodes connected in series with their forward directions opposite to each other. For example, the second stray capacitance C2 mainly includes the stray capacitance Cp of the diode. For example, the first stray capacitance C1 mainly includes the stray capacitance Cg generated between the conductor Cond11 and the conductor Cond12, as well as between the conductor Cond13 and the conductor Cond12, which are in conduction with the diode. For example, the third stray capacitance C3 mainly includes the stray capacitance Cs generated between the conductors Cond11, Cond12, and Cond13 of the wiring layer, and the semiconductor substrate Sub.

The first parasitic inductor L1 and the first parasitic resistance R1 are the parasitic inductor and parasitic resistance generated in the current path flowing through the above-mentioned stray capacitance Cg. The second parasitic inductor L2 and the second parasitic resistance R2 are the parasitic inductor and parasitic resistance generated in the current path flowing through the above-mentioned diode. Further, the third parasitic inductor L3 and the third parasitic resistance R3 are the parasitic inductor and parasitic resistance generated in the current path flowing through the above-mentioned stray capacitance Cs.

In the example illustrated in FIG. 1, since the combined capacitance of the stray capacitance Cg generated between the conductor Cond11 and the conductor Cond12 and between the conductor Cond13 and the conductor Cond12, and the stray capacitance Cp of the diode is represented as the first stray capacitance C1, the transient voltage absorbing element can be represented by a circuit including two paths between the signal line SL and the third terminal T3. However, when a circuit is represented with the stray capacitance Cg, which is generated between the conductor Cond11 and the conductor Cond12 and between the conductor Cond13 and the conductor Cond12, separated from the stray capacitance formed in the depletion layer of the diode, the transient voltage absorbing element 17 can be represented by a circuit including three paths between the signal line SL and the third terminal T3, as illustrated in FIG. 19.

Depending on the frequency of the signal or noise propagating through the signal line SL, the impedances of the first parasitic impedance Z1P, the second parasitic impedance Z2P, and the third parasitic impedance Z3P can vary. Thus, due to the magnitude relationship of the first parasitic impedance Z1P of the transient voltage absorbing element 17, the stray capacitances gradually disappear from the ones connected to the larger parasitic impedances. For example, in a configuration when the relationships Z3P>Z1P and Z3P>Z2P hold in the frequency band of communication signals, the influence of the third stray capacitance can be most effectively reduced in that frequency band. Further, for example, in a configuration when the relationship Z3P>Z2P>Z1P holds in a predetermined frequency band, the influence of the third stray capacitance C3 can be most effectively reduced, and the influence of the second stray capacitance C2 can be second most effectively reduced in that frequency band.

It is noted that, in the example illustrated in FIG. 19, the circuit including the three paths 1, 2, and 3 is illustrated, but the number of paths that can be represented is not limited to three.

Finally, it is generally noted that the exemplary aspects of the present invention are not limited to each embodiment described above. Modifications and changes can be appropriately made by those skilled in the art.

REFERENCE SIGNS LIST

BD diode
C1 first stray capacitance
C11, C12 stray capacitance
C1a, C1b capacitor
Cond11, Cond12, Cond13 conductor
C2 second stray capacitance
C21, C22, C23, C24, C25 stray capacitance
C3 third stray capacitance
Cc capacitor
Cp, Cp1, Cp2 stray capacitance
Cg, Cg1, Cg2, Cg3 stray capacitance
Cs, Cs1, Cs2, Cs3, Cs4 stray capacitance
L1 first parasitic inductor
L2 second parasitic inductor
L3 third parasitic inductor
La, Lb inductor
Lc inductive element
Epi N-type epitaxial layer
Ins1, Ins2, Ins3, Ins4, Ins5 insulator
R1 first parasitic resistance
R2 second parasitic resistance
R3 third parasitic resistance
Rb resistance component
Sub semiconductor substrate
SL signal line
SR1, SR2, SRT solder resist film
T1 first terminal
T2 second terminal
T3 third terminal
TR trench
Z1P first parasitic impedance
Z2P second parasitic impedance
1 first path 2 second path
3 third path
11 to 17 transient voltage absorbing element
101, 102, 103, 104, 105, 106, 107 transient voltage absorbing circuit

The invention claimed is:

1. A transient voltage absorbing element comprising:
a first path that includes a first stray capacitance, a first parasitic inductor, and a first parasitic resistance connected in series; and
a second path that includes a second stray capacitance, a second parasitic inductor, and a second parasitic resistance connected in series,
wherein the first and second paths are connected in parallel to each other and connected in shunt between a signal line and a reference potential, and
wherein a first parasitic impedance due to the first parasitic inductor and the first parasitic resistance and a second parasitic impedance due to the second parasitic inductor and the second parasitic resistance are different in a frequency band of a signal that propagates through the signal line.

2. The transient voltage absorbing element according to claim 1, wherein the first stray capacitance inserted on the first path or the second stray capacitance inserted on the second path that is located on a side of one of the first parasitic impedance and the second parasitic impedance that achieves a higher parasitic impedance in the frequency band of the signal has a reduced influence.

3. The transient voltage absorbing element according to claim 1, wherein one of the first stray capacitance and the second stray capacitance includes a stray capacitance caused by a diode in a semiconductor substrate.

4. The transient voltage absorbing element according to claim 3, wherein a stray capacitance of the first and second stray capacitances, other than the stray capacitance caused by the diode, includes a stray capacitance generated between a wire of a wiring layer and the semiconductor substrate.

5. The transient voltage absorbing element according to claim 1, further comprising a third path that includes a third stray capacitance, a third parasitic inductor, and a third parasitic resistance connected in series, the third path connected in shunt between the signal line and the reference potential.

6. The transient voltage absorbing element according to claim 5, wherein the first stray capacitance includes a stray capacitance generated between wires of a wiring layer.

7. The transient voltage absorbing element according to claim 6, wherein the second stray capacitance includes a stray capacitance generated in a depletion layer of a diode.

8. The transient voltage absorbing element according to claim 7, wherein the third stray capacitance includes a stray capacitance generated between the wires of the wiring layer and a semiconductor substrate.

9. A transient voltage absorbing circuit comprising:
a signal line;
a plurality of inductors connected in series on the signal line; and
a transient voltage absorbing element connected in shunt between the signal line and a reference potential, the transient voltage absorbing circuit including:
a first path that includes a first stray capacitance, a first parasitic inductor, and a first parasitic resistance connected in series, and
a second path that includes a second stray capacitance, a second parasitic inductor, and a second parasitic resistance connected in series,
wherein a first parasitic impedance due to the first parasitic inductor and the first parasitic resistance and a second parasitic impedance due to the second parasitic inductor and the second parasitic resistance are different in a frequency band of a signal that propagates through the signal line.

10. The transient voltage absorbing circuit according to claim 9, wherein the first stray capacitance inserted on the first path or the second stray capacitance inserted on the second path that is located on a side of one of the first parasitic impedance and the second parasitic impedance that achieves a higher parasitic impedance in the frequency band of the signal has a reduced influence.

11. The transient voltage absorbing circuit according to claim 9, wherein each of the first path and the second path are connected in parallel to one another and in shunt between the signal line and the reference potential.

12. The transient voltage absorbing circuit according to claim 9, wherein one of the first stray capacitance and the second stray capacitance includes a stray capacitance caused by a diode formed in a semiconductor substrate.

13. The transient voltage absorbing circuit according to claim 12, wherein a stray capacitance of the first and second stray capacitances, other than the stray capacitance caused by the diode, includes a stray capacitance generated between a wire of a wiring layer and the semiconductor substrate.

14. The transient voltage absorbing circuit according to claim 9, further comprising a capacitor connected in parallel with the plurality of inductors.

15. The transient voltage absorbing circuit according to claim 9, further comprising a third path that includes a third stray capacitance, a third parasitic inductor, and a third parasitic resistance connected in series, the third path connected in shunt between the signal line and the reference potential.

16. The transient voltage absorbing circuit according to claim 15, wherein the first stray capacitance includes a stray capacitance generated between wires of a wiring layer.

17. The transient voltage absorbing circuit according to claim 16, wherein the second stray capacitance includes a stray capacitance generated in a depletion layer of a diode.

18. The transient voltage absorbing circuit according to claim 17, wherein the third stray capacitance includes a stray capacitance generated between the wires of the wiring layer and a semiconductor substrate.

* * * * *